United States Patent
Kluge

(10) Patent No.: US 7,486,346 B2
(45) Date of Patent: Feb. 3, 2009

(54) PORTABLE DATA CARRIER WITH A DISPLAY DEVICE HAVING A REFLECTION LAYER AS A SEPARATE COMPONENT AND APPLIED SEPARATELY FROM THE DISPLAY DEVICE

(75) Inventor: Stefan Kluge, Munich (DE)

(73) Assignee: Giesecke & Devrient GmbH, Munich (DE)

( * ) Notice: Subject to any disclaimer, the term of this patent is extended or adjusted under 35 U.S.C. 154(b) by 86 days.

(21) Appl. No.: 10/525,515

(22) PCT Filed: Aug. 27, 2003

(86) PCT No.: PCT/EP03/09500

§ 371 (c)(1), (2), (4) Date: Sep. 2, 2005

(87) PCT Pub. No.: WO2004/025552

PCT Pub. Date: Mar. 25, 2004

(65) Prior Publication Data

US 2006/0144952 A1    Jul. 6, 2006

(30) Foreign Application Priority Data

Aug. 28, 2002   (DE) ............................... 102 39 564

(51) Int. Cl.
*G02F 1/1333* (2006.01)
*G06K 19/00* (2006.01)

(52) U.S. Cl. ............................ 349/58; 349/113; 235/492
(58) Field of Classification Search .................... 349/58, 349/112, 113; 235/492; G02F 1/1333; G06K 19/00
See application file for complete search history.

(56) References Cited

U.S. PATENT DOCUMENTS

| 4,795,895 | A   |   | 1/1989 | Hara et al. |
| 4,876,441 | A   |   | 10/1989 | Hara et al. |
| 6,019,284 | A   | * | 2/2000 | Freeman et al. .............. 235/380 |
| 6,293,470 | B1  | * | 9/2001 | Asplund ..................... 235/487 |
| 2002/0020491 | A1 |   | 2/2002 | Price et al. |
| 2003/0073327 | A1 | * | 4/2003 | Gundlach et al. ............. 439/64 |

FOREIGN PATENT DOCUMENTS

| DE | 199 63 165 A | 3/2001 |
| DE | 199 54 841 A | 5/2001 |
| JP | 11120312 A * | 4/1999 |

* cited by examiner

*Primary Examiner*—David Nelms
*Assistant Examiner*—John Heyman
(74) *Attorney, Agent, or Firm*—Rothwell, Figg, Ernst & Manbeck P.C.

(57) ABSTRACT

A card-shaped electronic data carrier, in particular chip card, has a card body (19) with a recess (21) located on a top side of the card (20), which accommodates a display (1). In a base surface (22) of the recess a reflection layer (23) is disposed. The recess (21) is formed in a multi-step fashion. The contact surfaces (6) of the display (1) are directed towards the base surface (22) of the recess (21) and rest against countercontact surfaces (26) on a step of the recess (21).

11 Claims, 4 Drawing Sheets

PORTABLE DATA CARRIER WITH A DISPLAY DEVICE HAVING A REFLECTION LAYER AS A SEPARATE COMPONENT AND APPLIED SEPARATELY FROM THE DISPLAY DEVICE

CROSS-REFERENCE TO RELATED APPLICATION

This application is a National Phase of International Application Serial No. PCT/EP03/09500, filed Aug. 27, 2003.

FIELD OF THE INVENTION

The invention relates to a method for producing a portable, card-shaped, electronic data carrier, in particular a chip card, credit card, check card, money card and the like, with a display, which reflects light in certain areas and with a card body with a recess, which accommodates the display. Furthermore, the invention relates to a respective portable data carrier, in particular a chip card.

DESCRIPTION OF THE BACKGROUND ART

The display of a chip card mostly is inserted as a prefabricated unit into a prepared recess in the chip card during the production, so as to keep the production effort to a minimum when manufacturing chip cards. A prefabricated reflective display, i.e. a display, the display function of which is achieved by reflection/absorption of incident light, has a reflection layer which is located on the underside of a substrate carrier layer and a liquid crystal layer which is located on the top side of the substrate carrier layer between two conductive path layers. The external conductive path layer of the prefabricated display is covered with a transparent cover layer. The display inserted into the recess is contacted to conductive path ends protruding from above into the recess. Finally, on top of the display inserted into the recess and contacted a cover foil is drawn, so as to cover the contacting pad.

The flat displays available at present, however, are sensitive to temperature loads, such as occurring during lamination, when for example layers made of thermoplastics are bonded to each other under pressure and temperature. Therefore, it is required to arrange the production methods in such a way, that loads do not occur or only to a minimum degree. With this the production costs inevitably rise, since more expensive machines and apparatuses for manufacturing the cards have to be employed. The reject rate increases during the production process of such a card.

It is therefore desired to insert the display into the card at a point of time as late as possible in the production process. With a reflective display, however, the reflection layer always is located on the underside of the display, such reflection layer mostly consisting of vapor-deposited metal, while the connecting points for the display are located on the top side of the display facing away from the reflection layer, so as to avoid production-related short circuits between the connecting points caused by the reflection layer. Due to this structure it is not possible to insert such a display into the card in a very late stage of the production process, because at least yet the contacts pointing towards the card surface have to be contacted and the contact pads have to be covered with a cover foil.

SUMMARY OF THE INVENTION

It is therefore the problem of the present invention to provide a method for producing a portable data carrier, in particular a chip card, with reflective display, with which the display is mountable in a last procedure step.

This problem is solved by a portable data carrier and a method for producing it as described herein. Advantageous developments and embodiments of the invention also are specified.

According to the invention it is provided, that the recess, into which the display is inserted, at first on its base surface is equipped with a reflection layer. This can be advantageously effected by putting in a reflector prefabricated by applying a reflection layer to a reflector substrate. Meanwhile, the display is prefabricated in a basically usual fashion, however, without a reflection layer. The display prefabricated in such a way then is inserted into the recess, the contact surfaces of the display being directed towards the recess and resting against countercontact surfaces of the recess.

Since the contact surfaces of the display do not point to the outside of the card, but directly after being inserted come into contact with the countercontact surfaces of the recess, the display can be inserted in a last processing step. The low loading capacity of the display as to temperatures as well as pressure and bending, therefore, has not to be taken into consideration until this point of time when manufacturing a portable data carrier. In particular, it is not required to apply an additional card cover layer, so as to cover any contacting pad. By permitting a use of basically conventional and low-cost manufacturing techniques for realizing the inventive method, the manufacturing in total is cheaper.

In a preferred embodiment the countercontact surfaces are formed on a step disposed between the top side of the card and the base surface, and the display has a corresponding step with countercontact surfaces formed thereon. I.e. the countercontact surfaces and the reflection layer on the base surface of the recess are located on different levels, as a result of which the requirements as to positioning accuracy when applying the reflection layer are reduced. And this reduces the danger of short circuits between the reflection layer and the countercontact surfaces. The contact surfaces of the display in this case can also be located in the conventional fashion on a part of the display carrier substrate jutting out beyond the liquid crystal layer and formed as a component of the ITO display conductive paths.

The contact surfaces and countercontact surfaces advantageously are contacted by means of an anisotropic electroconductive adhesive so as to avoid reactive currents, which could cause a short circuit between the contacts. With this the display simultaneously is fixed in the recess.

In a favourable embodiment the display is flush with the top side of the card, so that there is no need for further cover layers.

A particular advantage of the invention is to be seen in the fact, that for its realization usual displays with a conventional layer structure can be used, which differ in only one point namely that they have no vapor-deposited reflection layer—which instead is separately applied to the base surface of the recess—and which, besides, are inserted into the recess in a direction inverse to the usual mounting direction, so that the substrate layer originally meant to be the inside layer becomes the cover layer.

If it is possible to process the display on ones own, in an advantageous variation of the inventive method there can be provided to apply the reflection layer to the surface of the display usually forming the top side, before the display is inserted into the prepared card body.

BRIEF DESCRIPTION OF THE DRAWINGS

In the following the invention is explained in detail with the help of an embodiment and with reference to the accompanying figures.

DETAILED DESCRIPTION OF INVENTION

Figure 7:
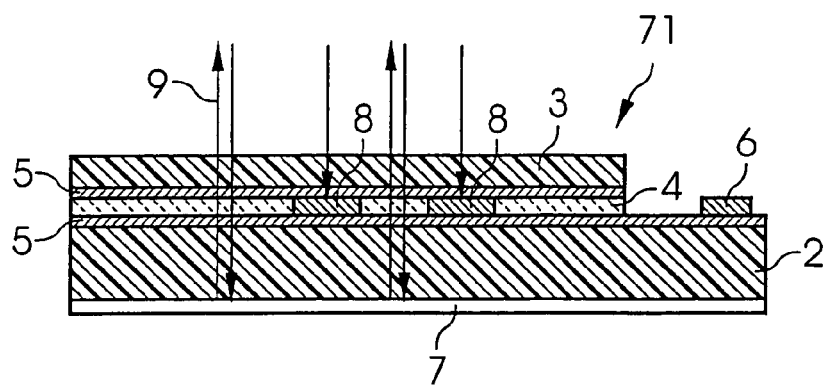
FIG. 7 shows a reflective display according to prior art in cross section.

FIG. 7 at first schematically shows in cross section a so-called "reflective" display 71, i.e. a display which reflects light in certain areas, according to prior art. The display 71 consists of a bottom carrier substrate 2, a top carrier substrate 3 and a liquid crystal layer 4 disposed between these two substrates. Above as well as below the liquid crystal layer 4 are disposed semi-transparent ITO conductive path layers 5. In an area of the bottom carrier substrate 2 horizontally protruding beyond the liquid crystal layer 4, on the conductive path layer 5 contact surfaces 6 are disposed, which can also consist of, for example, ITO. To the side of the bottom carrier substrate layer 2 facing away from the liquid crystal layer 4 a reflection layer 7 is applied.

By applying and not-applying voltage to individual drive areas 8 the transmittance of light of the liquid crystal layer 4 can be controlled. Drive areas 8, to which no voltage is applied, are opaque and appear dark. Drive areas 8, to which voltage is applied, change their optical polarization effect, become transparent and appear bright. If voltage is applied, from the side facing the viewer, i.e. through the top carrier substrate 3, light incident on the display 71 penetrates the top carrier substrate 3, the liquid crystal layer 4 as well as the bottom carrier substrate 2 and is reflected at the reflection layer 7, so as to retreat on the inverse way. If, however, to the liquid crystal layer 4 no voltage is applied, the respective drive areas 8 become opaque and interrupt the optical path indicated by the arrows 9, the areas 8 appear dark.

Figure 8:
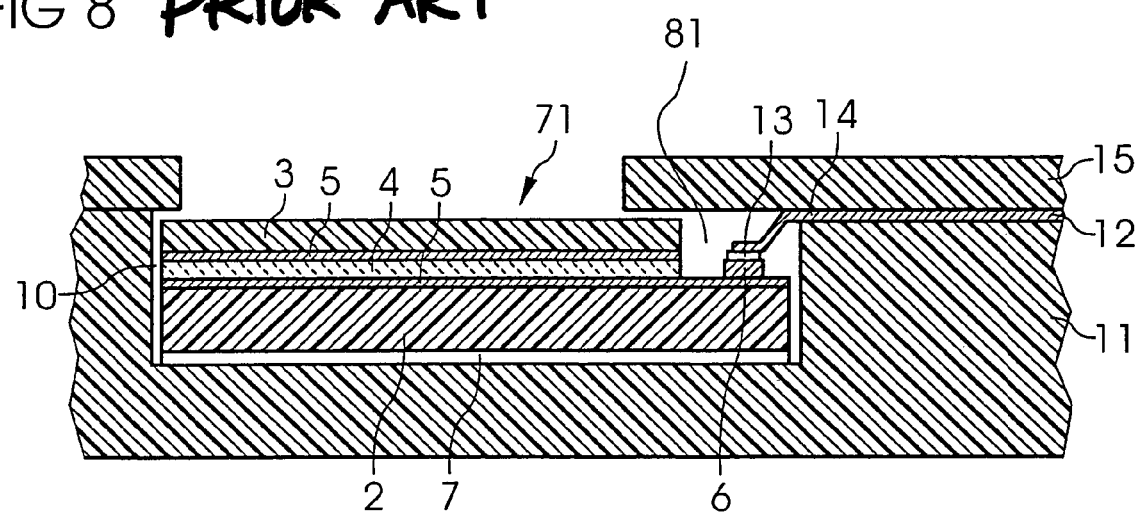
FIG. 8 shows a detail of a portable data carrier with display according to prior art in cross section.

FIG. 8 shows a portable data carrier in a partial cross section according to prior art with a display 71 according to FIG. 7. The two-step display 71 with the components top carrier substrate 3, liquid crystal layer 4, bottom carrier substrate 2, conductive path layer 5 and reflection layer 7 is inserted into a recess 10, which is milled out in a card body 11. At the top side of the card body 11 conductive paths 12 are disposed, which protrude into the recess 10 and via a conductive adhesive 13 form connections or countercontact surfaces 14 to the outwardly pointing contact surfaces 6 of the display 71. Above the conductive paths 12 the card is covered with a separate cover foil 15. The cover foil at the same time covers a part of the recess 10 including the contacting 6, 13, 14. In the contacting area thereby arises a basically undesired hollow space 81, which normally is filled by putting in a filling material.

Figure 1:
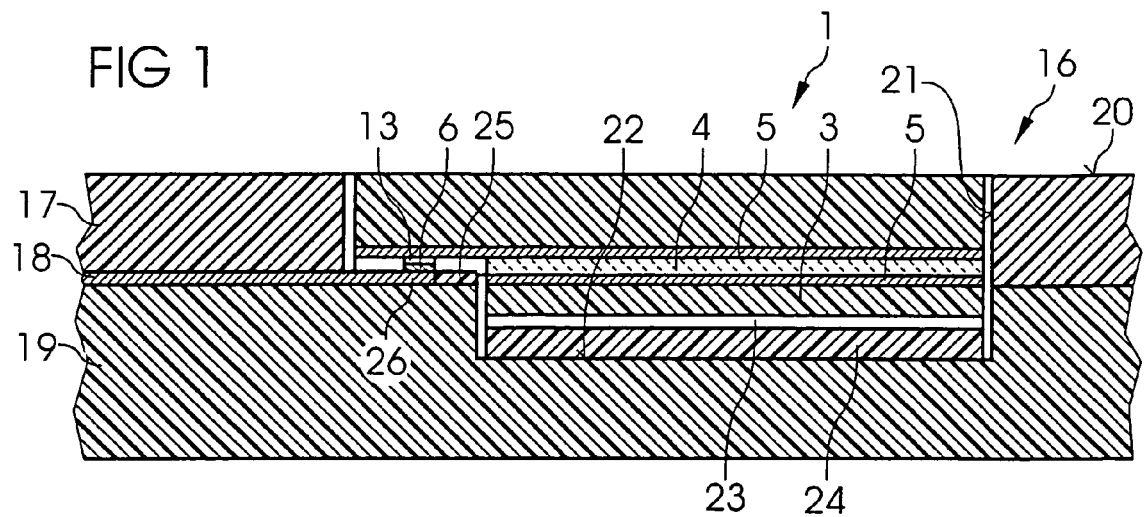
FIG. 1 shows a detail of a portable data carrier with display in cross section.

FIG. 1 in cross section shows a portion of an inventive data carrier 16 with a reflectively working display device 1. In the following it is assumed, that the data carrier 16 has the shape of a chip card, i.e. a card 16, for the display device 1 a reflective display is the basis.

The display 1 in principle has the same structure as the display 71 shown in FIG. 7 according to prior art, namely a bottom carrier substrate layer 2, a liquid crystal layer 4 as well as a top carrier substrate layer 3. In contrast to a display according to the prior art, however, the layers 2, 3, 4 are disposed in an inverse order with respect to their position when inserting the display. On both sides of the liquid crystal layer 4 again the conductive path layers 5 are disposed.

The card 16 has a cover layer 17 and a card body 19 as well as conductive paths 18 located in between. In the cover layer 17 and the card body 19 from the top side of the card 20 a recess 21 is milled out. On the base surface 22 of this recess a reflector, consisting of a reflection layer 23 and a reflector substrate 24, is applied and firmly connected to the base surface 22. In contrast to the prior art illustrated with the help of the FIGS. 7 and 8, the reflection layer 23 here is not component of the display 1, but is separated from it and incorporated separately into the recess 21.

The recess 21 has a step 25 disposed plane-parallel to the top side 20 of the card 16. In an area of the bottom carrier substrate 2 horizontally protruding beyond the liquid crystal layer 4, on the conductive path layer 5 a contact surface 6 is disposed. The contact surface 6 for example by means of an anisotropic electroconductive adhesive 13 is connected to a countercontact surface, which is formed on the conductive paths 18.

Figure 2:
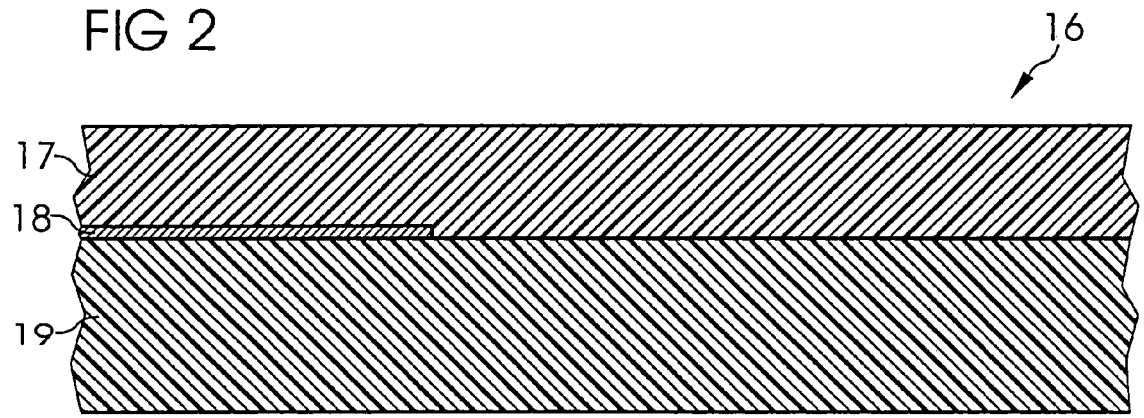
FIGS. 2 to 5 show a data carrier according to FIG. 1 in different stages of the production method.

In the following the inventive manufacturing of a data carrier is illustrated. FIG. 2 in a first step of the production method shows a semifinished product provided for the card 16, consisting of the cover layer 17, the conductive paths 18 and the card body 19. The conductive paths 18 can form a separate layer in the semifinished product namely as a conductive path inlay or can be produced directly on the card body. All procedure steps, which entail unfavourable thermal or mechanical loads for a display, in particular foil laminating steps, have already been carried out with this semifinished product.

Figure 3:
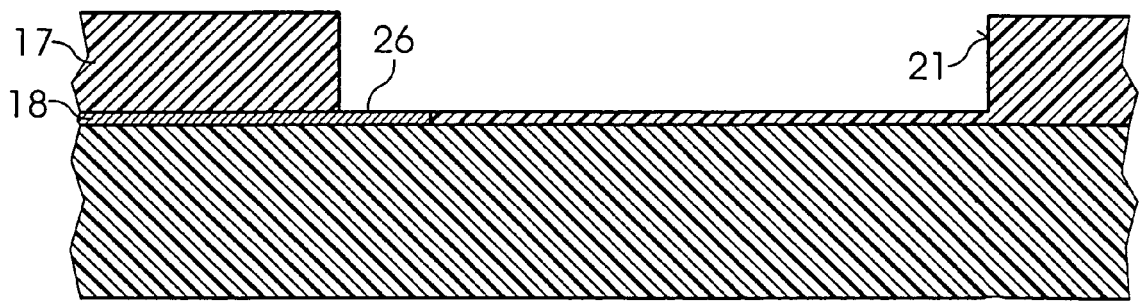
Figure 4:
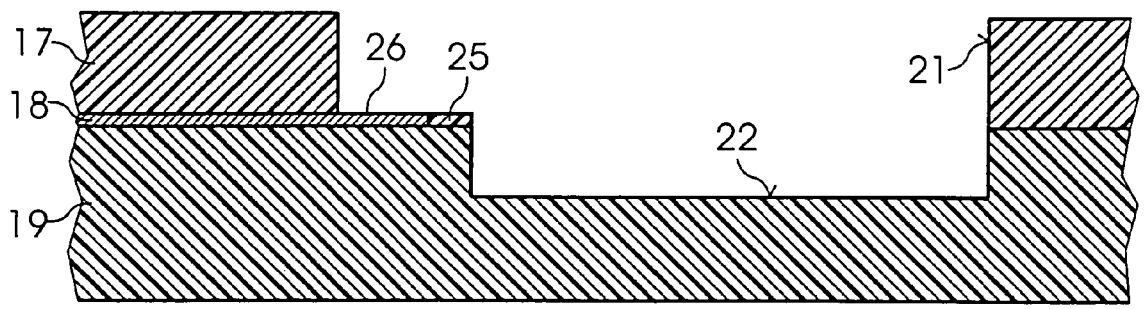

FIG. 3, in cross section, shows the milling out of a recess 21 in the area of the display to be inserted later. Here at first the cover layer 17 is removed to such a degree, that in the area of the conductive paths 18 the countercontact surfaces 26 are uncovered. Then, as shown in FIG. 4, the recess 21 is further deepened into the card body 19, as long as the base surface 22 of the recess 21 lies in the desired depth. With that a step 25 with the countercontact surface 26 remains on the level of the first milling step. The steps according to FIGS. 3 and 4 can also be carried out in a different order.

Figure 5:
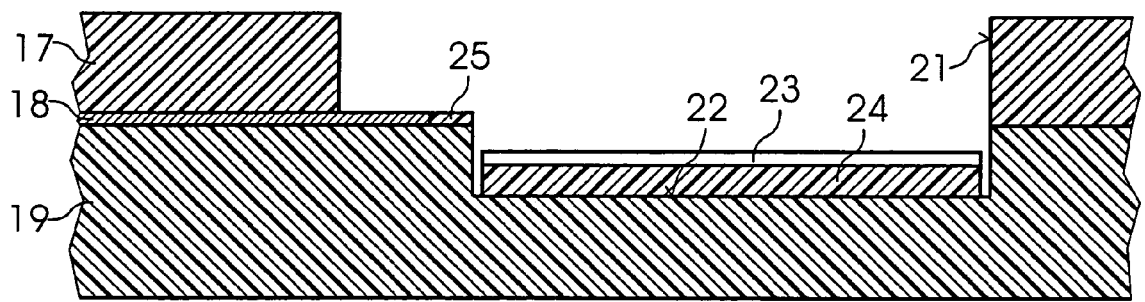

In the following procedure step shown in FIG. 5 to the base surface 22 of the recess 21 the reflector substrate 24 with the reflection layer 23 is applied and connected to the base surface 22, e.g. by bonding. Reflection layer 23 and reflector substrate 24 here can be applied successively into the recess 21 or mounted in the form of prefabricated reflectors. I.e. the manufacturing or mounting of the reflection layer 23 is effected separately from the incorporation of the display 1 to be carried out subsequently, which accordingly does not have to have a reflection layer.

Then the display 1 is inserted into the recess 21 and the contact surfaces 6 are contacted to the countercontact surfaces 26. A data carrier 16 is the result, such as shown in FIG. 1, which in particular does not have hollow spaces in the area of the display 1.

In a subsequent manufacturing step the remaining gaps between the display 1 and the recess 21 can be sealed by filling them for example with an adhesive or a different suitable filling. This step can also be carried out together with the preceding step.

Expediently, there can be provided, that the entire new card finally is covered with an overlay foil.

Figure 6:
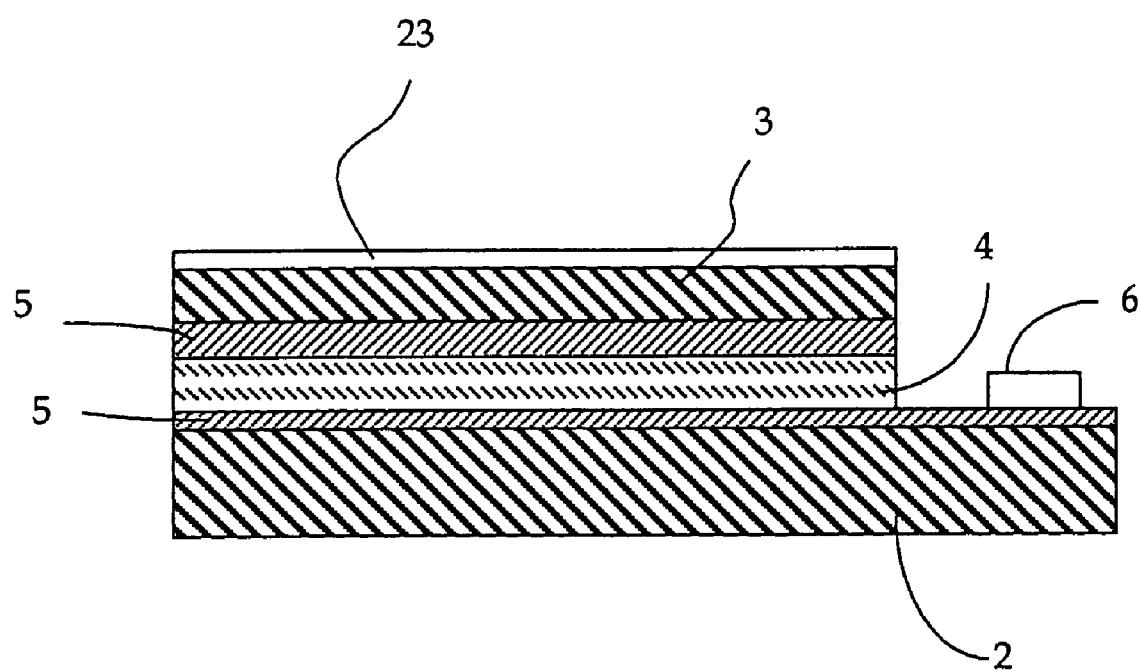
FIG. 6 shows a variant of the method, in which the reflection layer is applied onto the display before the mounting.

If there exists the possibility to carry out manufacturing steps for the display 1 on ones own, there can be provided, that the reflection layer 23, before it is mounted into the card body 19, is positioned directly on the top carrier substrate 3 of the display 1. This variant is illustrated in FIG. 6.

The invention claimed is:

1. Method for producing a portable data carrier with a display device, comprising the steps:
   providing a semifinished product with conductive paths (18) disposed in the interior,
   producing a recess (21) in the semifinished product,
   uncovering countercontact surfaces (26) of the conductive paths (18) in the recess (21),
   separately applying a reflection layer (23) that is not a component of the display device (1) onto the base surface (22) of the recess (21),
   inserting the display device (1) having no reflection layer component into the recess (21), so that the display device (1) together with the separately applied reflection layer (23) forms a reflective display, and
   contacting the countercontact surfaces (26) with contact surfaces (6) of the display device (1).

2. Method according to claim 1, characterized in that the recess (21) is formed in a multi-step fashion, the countercontact surfaces (26) being uncovered on a step (25) of the multi-step recess (21) located above the base surface (22).

3. Method according to claim 1, characterized in that the contact surfaces (6) of the display device (1) and the countercontact surfaces (26) of the recess (21) are contacted by means of an anisotropic electroconductive adhesive (13).

4. Method according to claim 1, characterized in that the display device (1) is inserted into the recess (21) in such a way that it is flush with a surface (20) of the semifinished product.

5. Method according to claim 1, wherein gaps between the recess (21) and the display device (1) inserted into the recess are sealed with a filling.

6. The method of claim 1, wherein said portable data carrier with display device is a chip card with display.

7. Portable data carrier with display device, comprising:
   a card body with conductive paths disposed in the interior of the card body,
   a recess, located on a top side of the card body, which accommodates the display device,
   countercontact surfaces, in the recess, which are formed by the conductive paths, which are contacted to contact surfaces of the display device, and which are directed towards the base surface of the recess, and
   a reflection layer separately applied onto a base surface of the recess, the reflection layer not being a component of the display device.

8. Data carrier according to claim 7, characterized in that the recess (21) is formed in a multi-step fashion, wherein the countercontact surfaces (26) are formed on a step (25) of the multi-step recess (21) disposed between top side of the card body (20) and base surface (22) and wherein the display device (1) has a corresponding step with contact surfaces (6) formed thereon.

9. Data carrier according to claim 7, characterized in that the contact surfaces (6) and countercontact surfaces (26) are connected with an anisotropic electroconductive adhesive (13).

10. Data carrier according to claim 7, characterized in that the display device (1) is flush with the top side of the card body (20).

11. The portable data carrier of claim 7, wherein said portable data carrier with display device is a chip card with display.

\* \* \* \* \*